United States Patent [19]

Pommier et al.

[11] Patent Number: 4,881,241
[45] Date of Patent: Nov. 14, 1989

[54] METHOD AND INSTALLATION FOR DIGITAL COMMUNICATION, PARTICULARLY BETWEEN AND TOWARD MOVING VEHICLES

[75] Inventors: Daniel Pommier, Breal sous Montfort; Michel Alard, Rennes, both of France

[73] Assignees: Centre National d'Etudes des Telecommunications, Issy les Moulineaux; Telediffusion de France, Paris, both of France

[21] Appl. No.: 159,920

[22] Filed: Feb. 24, 1988

[30] Foreign Application Priority Data

Jul. 2, 1986 [FR] France .................. 86-09622
Sep. 23, 1986 [FR] France .................. 86-13271

[51] Int. Cl.$^4$ .......................................... H04B 7/02
[52] U.S. Cl. ............................ 375/38; 371/43;
371/45; 375/58; 455/59
[58] Field of Search ............... 375/38, 40, 58; 455/50,
455/54, 59; 371/43, 44, 45; 381/13, 14

[56] References Cited

U.S. PATENT DOCUMENTS

| | | | |
|---|---|---|---|
| 2,705,795 | 4/1955 | Fisk et al. | 375/40 |
| 2,895,128 | 7/1959 | Bryden | 375/40 |
| 2,982,852 | 5/1961 | Fano | 375/38 |
| 3,226,644 | 12/1965 | Goode et al. | 375/40 |
| 4,545,054 | 10/1985 | Davis | 371/43 |
| 4,641,327 | 2/1987 | Wei | 371/43 |
| 4,677,626 | 6/1987 | Betts et al. | 371/43 |

*Primary Examiner*—Benedict V. Safourek
*Attorney, Agent, or Firm*—Larson and Taylor

[57] ABSTRACT

A digital broadcasting process, suitable for digital audiobroadcast, comprises encoding the data in the form of binary words using a redundant code to obtain a sequence of modulation symbols and transmitting the symbols in a plurality of subchannels at different frequencies. The symbols are time interlaced with such a distribution that two adjacent symbols cannot be transmitted in time succession and at the same one of the frequencies. Preferably, a Viterbi decoder is used. Particular construction of an emitter and a receiver are also described.

8 Claims, 6 Drawing Sheets

METHOD AND INSTALLATION FOR DIGITAL COMMUNICATION, PARTICULARLY BETWEEN AND TOWARD MOVING VEHICLES

BACKGROUND OF THE INVENTION

1. Technical Field

The invention relates to broadcasting of data in digital form in an environment disturbed by noise and/or by the existence of multiple paths. It is particularly suitable for use in digital sound broadcasting toward movable receivers, since sound transmission makes it practically impossible to repeat sequences and consequently requires a high degree of immunity from the transmission system.

Difficulties in broadcasting towards vehicles—or communication of vehicles with each other—result from disturbing phenomena whose characteristics (frequency, amplitude, duration, ... ) vary greatly depending on the origin of the phenomena, on the frequency band used and the location of the vehicle carrying the receiver in the reception zone.

2. Prior Art

Numerous methods are already known for limiting reception disturbances:

repeating the transmitted data and detecting (and possibly correcting) errors on arrival, which limits the effect of pulsed noise, even if it has a wide band;

coding the data using a convolutive code providing redundancy which increases the distance between transmitted signals and reduces the number of errors on reception;

increasing the duration of each of the symbols transmitted, which has a favorable as regards all disturbances but which limits the maximum rate, if a single frequency is used or requires frequency multiplexing (U.S. Pat. No. 2,705,795);

so called "frequency jump" broadcasting, consisting in transmitting the successive symbols alternately on several frequencies, only one of which is used at a time, which reduces the influence of echos and recurrent jamming, because they only act on a limited frequency range, while they may be continuous;

data interlacing which reduces the influence of disturbances of limited duration.

None of these solutions is completely satisfactory in a reception site affected by disturbances of different kinds, corresponding to different parts of the time-frequency space. That situation typically exists when broadcasting in a city environment, where there are numerous radio electric echos and disturbances of home or industrial origin.

SUMMARY OF THE INVENTION

It is an object of the invention to improve data broadcasting towards movable receivers; it is a more specific object to improve reception reliability in presence of multiple paths and to reduce the influence of noise.

The invention uses the ideas summarized above but combines them in a unique way and it completes them for obtaining a reliability which is greatly improved as compared with that obtained if one element of the combination is omitted.

A method in accordance with the invention for broadcasting data from a source includes sampling the information to obtain data consisting of digital samples; coding the bits using a redundant code leading to modulation symbols $A(f_i, t_j)$; transmitting said symbols and distributing them in parallel in the frequency f-time t space with symbol interlacing and simultaneous transmission over M broadcasting frequencies or subchannels (M being greater than 1). With this method, two successive symbols A are never transmitted at successive times in a same frequency channel.

Parallel distribution of symbols may for instance be achieved with parallel transmission of orthogonally multiplexed symbols, as described in "A 19,2 Kbps voice band data modem based on orthogonally multiplexed QAM techniques", Hirosaki et al, IEEE International Conference on Communications, 1985, pp. 661–665. However, that approach alone would not be sufficient. Reference may also be made to "Advanced Groupband Data Modem using Orthogonally Multiplexed QAM Technique" by Hirosaki et al (IEEE Transactions on Communications, Vol. COM-34, No. 6, June 1986, pp 587–592).

The distribution of symbols according to the invention is totally different from that found in "diversity" or frequency jump broadcasting for, at a given time, there are n elements which are broadcast rather than a single one. With this distribution mode, the duration of each element transmitted may be multiplied by M for a same rate, which improves the reception reliability by reducing the selective phenomena.

Independence (with respect to the channel) between successive symbols applied to a maximum likelihood decoder is essential for optimum performance of the system. Independence is obtained due to the double interlacing (in frequency and time) associated with coding according to the invention.

Reconstruction of a received message involves storing the elements for a time $t=T_s \cdot x$, $T_s$ being the time assigned to a symbols A and x being an integer corresponding to the total time concerned by the interlacing algorithm.

Frequency interlacing provides an additional degree of freedom (reduction of the intersymbol interference or ISI) and does not require a special synchronizing arrangement, which is favorable to simplicity. De-interlacing by the receiver consists in re-arranging the symbols into the order they had at the coder output. The redundancy introduced is used in the receiver by providing a decision algorithm which advantageously makes the choice by a posteriori searching for the maximum likelihood and determines which of all possible mosaics (that is the mosaics allowed by the code) is closest to the mosaic actually received.

The invention also provides a broadcasting installation for implementing the above method. The installation may include:

a transmitter having a convolutional encoder delivering digital samples, means for time interlacing the coded symbols and assigning to each one a longer transmission time duration through the use of several paths of a transmission channel, generally at different frequencies, and a receiver having de-interlacing means for recovering the coded symbols and storing them over a period of time sufficient to evaluate the original binary sequence by determining paths of maximum likelihood in the lattice or trellis diagram formed by the convolution.

The total digital data flow of a program is distributed over M broadcasting subchannels (i.e. between M carriers). Frequently a plurality L of programs are simultaneously broadcast, each over M carriers. Then the receiver has to handle M carriers among $N=L \cdot M$ carriers for receiving a selected program. As an example which may be considered as typical of digital audio broadcast (DAB) toward vehicles, L=16 stereophonic programs may have to be simultaneously sent, with a rate of about 2×200 kbits per second with M=16 carriers per program in a TV channel 8 MHz broad.

In a particular embodiment, there is one separate demodulator provided with an adjustable selection input filter for each one of the M subchannels dedicated to the same program, resulting in a high degree of complexity when the number M of subchannels is high.

On the other hand, the problems associated with digital transmission in a selective channel (i.e. when the digital rate to be transmitted is higher than the inverse of the width of the pulse response of the channel, which typically is about 5 μs) are well known. When a high degree of spectral efficiency is wished, an alphabet of symbols is used which has a narrow spectrum and a broad autocorrelation function, typically OFDM (orthogonal frequency division multiplexing) coding.

Such use requires the use of DFT by the receiver. As a consequence, its use has been restricted to systems having a data rate and a number of channels relatively low, for instance for transmitting data in the 60-104 kHz band, as a replacement to the partial response coding techniques described in Recommendation V37 of the C.C.I.T.T. A description of that process may be found in various references, for instance in "Data Transmission by Frequency Division Multiplexing Using the Discrete Fourier Transform" by S. B. Weinstein et al, IEEE COM., Vol. Com. 19, No. 5, October 1971 and in "An Orthogonally Multiplexed QAM System Using the Discrete Fourier Transform" by B. Hirosaki in IEEE COM., Vol. Com. 29, No. 7, July 1981.

It is a further object of the invention to eliminate the need to provide a number of demodulators equal to the number of subchannels in the receiver, while retaining a high degree of spectral efficiency, close to 1 bit/Hz.

For that purpose, there is provided a process wherein an OQAM coding is used and those M subchannels (and only those M subchannels) which correspond to a same program are simultaneously demodulated are reception by applying a DFT simultaneously to all said M subchannels.

In a preferred embodiment of the invention, an installation for data broadcast according to the above process comprises:

a transmitter for broadcasting a plurality of programs, having: a convolutional encoder delivering, from samples of the data to be broadcast, digital symbols for each of the programs; means for time interlacing the symbols and for distributing the symbols of a same program between a plurality of subchannels at different frequencies, the frequencies dedicated to different programs being interleaved, and a receiver having de-interlacing means and means for simultaneously demodulating and selecting a particular program in terms of DFT applied only to those subchannels which correspond to the selected program.

The invention will be better understood from the following description of particular embodiments given by way of examples, with reference to the accompanying drawings.

DETAILED DESCRIPTION

Figure 1:
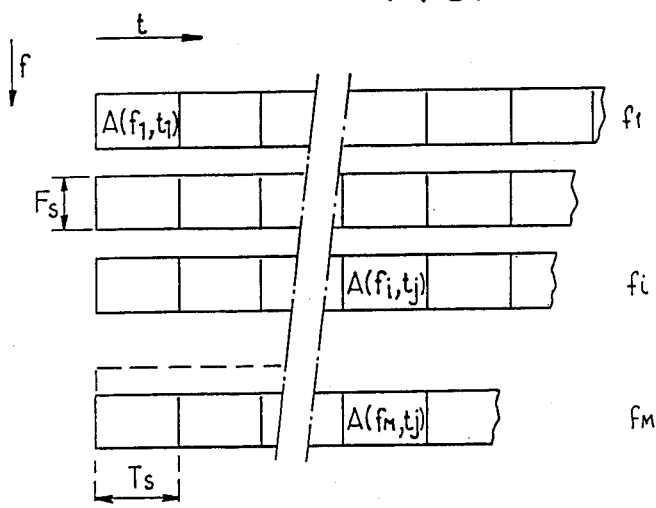
FIG. 1 is a general diagram showing distribution of successive coded symbols to be transmitted in the time-frequency space.

The method of the invention requires a sequence of steps including: for transmission, encoding then distribution of the information elements in frequency (frequency interlacing or distribution) and in time (time interlacing). The distribution may be as shown in FIG. 1. The discrete elements or symbols A obtained by digitization of successive samples of a signal, and encoding, are stored, then distributed in the frequency f/time t space. Referring to FIG. 1, n discrete elements A ($f_i$, $t_j$) are simultaneously transmitted at the same time $t_j$, each for a time $T_s$, at different frequencies f1, ... fi, ..., fM.

Figure 3:
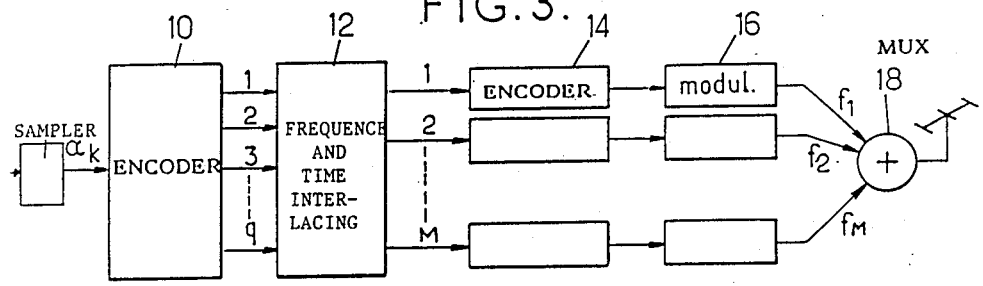
FIG. 3 is a general transmitting diagram implementing the method of the invention.

As shown in FIG. 3, the binary elements (bits) $a_k$ to be transmitted first are subjected to a convolutional coding causing redundancy to appear. Such encoding implies that the yield (ratio between the number of useful bits p at the input and the corresponding number of bits q at the output) is less than 1. A code may for example be used having a yield R=p/q=½ and this particular case will be discussed in greater detail later. For more details on convolutional codes, reference may for instance be made to Article "Convolutional Codes" in "Error Control Coding—Fundamentals and applications" par Shu Lin et al, Prentice Hall, 1979, pp. 287-314.

Encoder 10 delivers, with a delay related to the nature of the encoding algorithm, q bits over q different outputs for p input bits.

Figure 2:
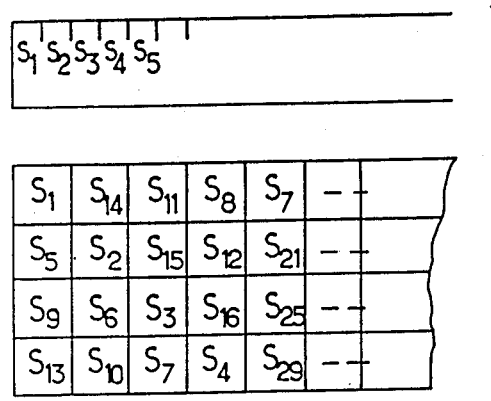
FIG. 2 shows a possible mosaic of symbols to be transmitted formed by time interlacing and frequency distribution.

The next step consists in achieving time and frequency interlacing. Provided that a sufficient number of subchannels are available, frequency interlacing allows to transmit each output bit S for a time $T_s$ greater than that of an input bit $a_k$, despite the lesser than 1 yield of encoder 10. FIG. 2 shows, by way of example, a possible time and frequency distribution of bits $S_1$, , $S_2$, ... delivered in succession by encoder 10, over four subchannels at different frequencies.

To reduce the spectral band required for transmission, the bits transmitted over each channel may be grouped into blocks of k bits by encoders 14. Then the successive blocks are applied to modulator 16 having $2^k$ states associated with oscillators at respective carrier frequencies f1, ..., fM. The outputs of the modulators drive a base band multiplexer 18 whose output is connected to the transmission antenna.

Figure 4:
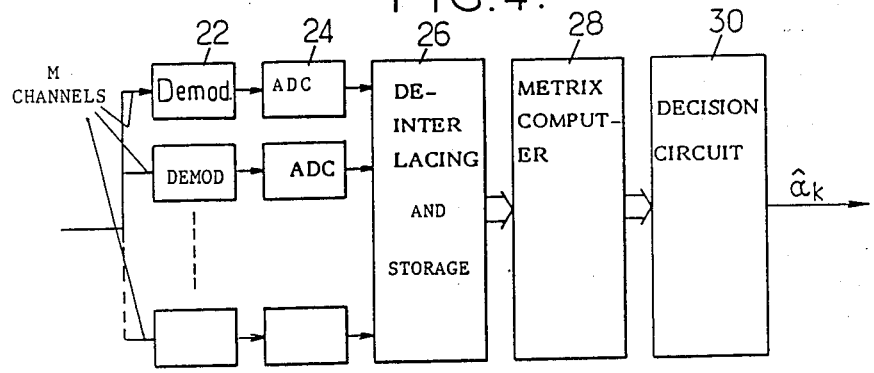
FIG. 4, similar to FIG. 3, is a reception diagram.

The receiver shown in diagrammatic form in FIG. 4 has M input channels each having a demodulator 22 with a frequency filter of width $F_s$ centered on one of the frequencies f1 to fM and an A/D converter 24. The outputs of the converter are connected to a unit for de-interlacing and delivering the estimated values $\hat{a}_k$ of the bits $a_k$ of the message applied to the transmitter, using the redundancy introduced by the convolutional code.

It is preferable to use a receiver having, downstream of the A/D converters 24, a decision logic which does not use "hard" detection by comparing the samples received with a predetermined threshold, but "soft" detection. Soft detection makes use of logics which make an a posteriori search for that mosaic of the A($f_i$, $t_j$) which corresponds to the maximum value of the metric $\Gamma$, defined as the probability density of the sequence received conditionally on transmission of a predetermined sequence. For that, each decision is taken after a number of symbols A($f_i$, $t_j$) greater than 1 have been considered. The number of signals depends on the code used; for convolutive coding its depends on the constraint length of the code.

Several types of algorithms may be used at reception, and particularly the Viterbi algorithm, described in "Convolutional Codes and Their Performances in Communication Systems", IEEE TRANS., Commun. Technol. Vol. COM., October 1971. Viterbi decoders are now available on the market.

The reception diagram is then of the kind shown in FIG. 4 which successively includes de-interlacing by 26 according to an algorithm stored in the receiver, metric computation by 28 and search for the shortest path through the graph i.e. the path corresponding to a maximum value of the metric by 30.

Figure 5:
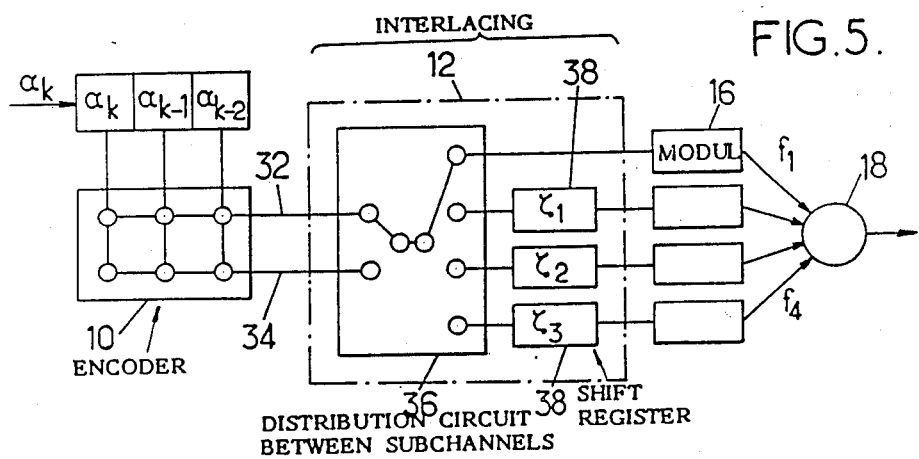
FIGS. 5 and 6 are diagrams corresponding to a particular embodiment of FIGS. 3 and 4.
Figure 6:
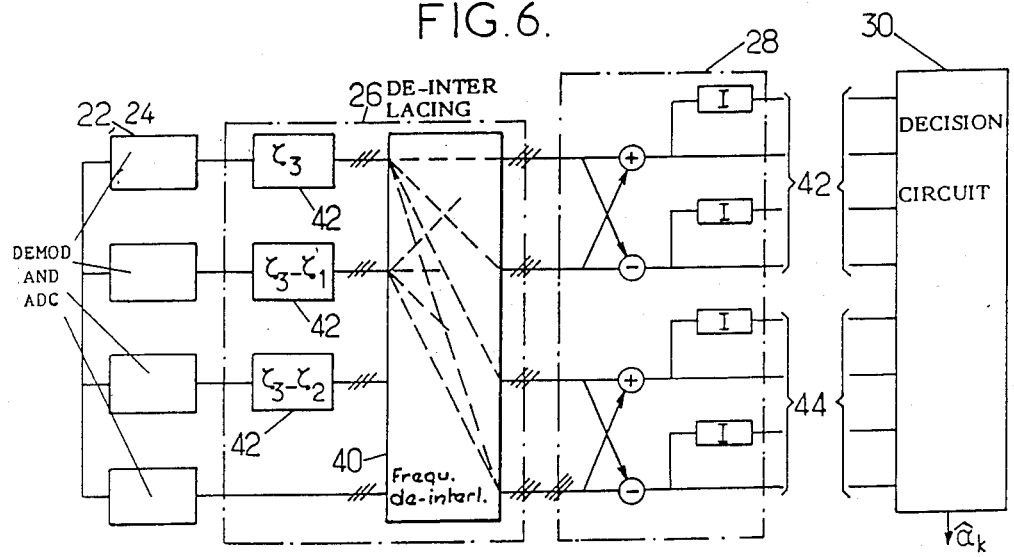

Referring to FIGS. 5 and 6, the general construction of a transmitter and a receiver will now be given by way of example, assuming that:

the yield of the convolutional code is p/q=½;

the trellis for determining the shortest path has four nodes and each branch of the trellis is coded on two bits;

the transmission channel has M=4 subchannels at frequencies f1, f2, f3, f4 spaced enough for being independent as regards perturbations of the transmission channel;

each subchannel is modulated at two levels (0 and 1).

Referring to FIG. 5, the transmitter includes a conventional convolutional encoder 10 which simultaneously delivers two bits, on outputs 32 and 34 respectively, for each information bit $a_k$, the encoding algorithm operating on three successive input bits.

The convolutional code used, as well as the interlacing algorithm, may be selected depending on the type of disturbances to be feared: in fact, the disturbances may have very different shapes in the time-frequency representation. For example, a Rayleigh attenuation is frequency and time selective; a pulsed noise corresponds to a wide frequency band but is localized in time. Time and frequency interlacing reduces the probability of false decisions by ensuring independence between successive samples with respect to disturbances on the channel.

Frequency interlacing of the bits in the transport channel is provided by a device 36 for distribution over four subchannels, shown schematically by a converter from two bit to four fit in parallel in FIG. 5. Time interlacing is obtained by means of shift registers 38 placed at the output of the distribution device 36, delaying the on-line bits by respective times $\tau_1$, $\tau_2$ and $\tau_3$ which are multiples of a predetermined value $T_s$ and which maintain the signals applied on the output for a time twice the period of the input data $a_k$.

As shown, the transmitter does not include circuits for block encoding and the modulation is binary. The outputs of device 36 are applied, directly for one of the subchannels and through a separate register 38 for the other subchannels, to respective modulators 16 which each receive carriers at frequencies f1, f2, f3 or f4. The type of modulation is advantageously such that the demodulators of the receiver may be simple, for example of the envelope detection or differential type. However, any amplitude, phase or frequency modulation may be used.

The receiver (FIG. 6) includes, downstream of conventional input, amplification and filtering stages (not shown), symmetrical with those of the transmitter.

As shown each subchannel includes a demodulator 22 delivering a sample at successive times separated by $$T = \frac{1}{D \times P/q} \cdot M$$

with:
D: useful linear flow rate
P/q: yield of the code
M: number of subchannels (or carriers).

Generally that part of the receiver situated downstream of the demodulator is digital and each subchannel then includes an A/D converter 24, delivering for example the sample coded as a three bits word to the time-de-interlacing circuit 26. This circuit is formed of three shift registers 42 causing delays complementary to those applied to the corresponding subchannels upon transmission. In this particular interlacing case, registers 42 automatically operate in synchronism due to the parallel transmission.

The frequency de-interlacing circuit 40 consists of a wired array for simultaneously delivering samples representative of the message coded by the convolutive encoder, but affected by noise, on four parallel outputs.

The samples, coded as three bits words, are applied to the metric computing unit 28 provided for calculating twice four correlation metrics delivering a decision signal over two successive branches of the lattice.

At any time kT the Viterbi decoder retains only one path ending to a node of the lattice based on the criterion of the largest metric (correlation). The decision circuit 30 applying the Viterbi algorithm delivers the evaluated binary elements $\hat{a}_k$. For rates of a few hundreds of kbits/s, a microcomputer may be used for implementing functions 28 and 30 whose software applies the Viterbi algorithm in real time.

Numerous other embodiments are possible. It will be appreciated that the decorrelation between carriers requires a minimum distance between carriers. This solution is particularly easy to implement when several separate transmission channels are provided: it is then natural to interleave the frequencies corresponding to different channels.

Figure 7:
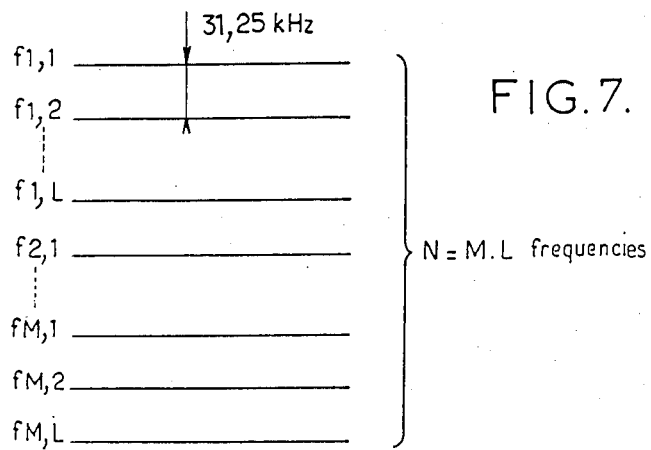
FIG. 7 is a diagram of a possible distribution of the frequencies used for simultaneously transmitting L programs, each in M subchannels having different frequencies.

Before another embodiment of the invention corresponding to simultaneous transmission of a plurality of program with such frequency interleaving is described, reference may be had to FIG. 7 which indicates a possible distribution of subchannels between L programs.

In a TV broadcast channel 8 MHz broad, it is possible to locate N=256 carriers at mutual intervals of 31,25 kHz. The M frequencies $f_{1,1}$; $f_{2,1}$; . . . $f_{M,1}$ allocated to the first program are selected among the N frequencies evenly distributed within the spectrum and interlaced with the frequencies allocated to the other programs for increasing the immunity to noise having a narrow frequency band. As a practical rule, and due to problems associated with the limited stiffness of the edges of the reception filter response, the number of carriers which are actually used will generally be lower than 256. For instance, M=14 carriers may be allocated to each of sixteen programs. With that distribution, 224 frequencies only are used among the 256 available frequencies.

For carrying out the process of the second embodiment of the invention, a particular technique of modulation is selected and a solution should be found for simultaneously demodulating all those carriers which correspond to a same program using a DFT (but not necessarily the other carriers).

The two aspects will be successively described.

1. OQAM is used for data transmission. Implementation may be as described in the article by Weinstein et al already mentioned. Each elementary symbol f(t) requires 2N bits and modulation is defined by:

$$-\Delta \leq t \leq NT: s(t) = \sum_{k=0}^{N-1} a(k) \cos 2\pi f_k t - b(k) \sin 2\pi f_k t \quad (1)$$

$$\text{elsewhere: } s(t) := 0$$

where $$f_k = f_0 + k/NT$$

$\Delta$ is a quiet period between two successive symbols.

If $T_s = \Delta + NT$ is the time duration required for one symbol, the transmitted signal may write as:

$$S(t) = \sum_{-\infty}^{+\infty} s(t - p T_s).$$

The data a(k) and b(k) of formula (1) then are a function of the index p.

If the transmission channel has a transfer function, H(f) and assuming that its pulse response has a support smaller than $\Delta$, then the contribution of the channel to the signal may be written as:

h(t)=0, for t<0 and t>$\Delta$.

In other words, the interference between symbols numbered p−1 and p affects the latter only for a time duration equal to or shorter than $\Delta$. The time interval [−$\Delta$,0] which is only for absorbing ISI and to protect the useful time interval [0,NT] may be neglected.

The signal x(t) received by the receiver for p=0, during the time interval [0,NT] may be written as:

$$x(t) = \sum_{k=0}^{N-1} \rho_k [a(k) \cos (2\pi f_k + \phi_k) - \quad (2)$$

$$b(k) \sin (2\pi f_k t + \phi_k)]$$

In formula (2),
$\rho_k$ exp (j$\phi_k$) is the response of the channel at frequency $f_k$;
$\phi_k$ is the phase shift introduced by the line; and
$\rho_k$ is a predetermined factor.

If now a variable X(k) is defined as:

$$X(k) = [a(k) + jb(k)]\rho_k \exp (j\phi_k) \quad (3)$$

then:

$$x(t) = Re\left[\sum_{k=0}^{N-1} X(k) \exp (2j\pi f_k t)\right]$$

(Re designating the real part) for $0 \leq t \leq NT$.

The demodulation process should restitute the successive values X(k) from the received signal x(t). For simplification, only the demodulation process of the elementary symbol s whose serial number is p=0, will be considered. The same operation has to be repeated at successive time intervals $T_s$. The time interval [−$\Delta$,0] may be neglected. However, $\Delta$ should remain small as compared with $T_s$ since it corresponds to a useless consumption of transmitted power.

2. Demodulation is carried out by projecting the received signal x(t) on two quadrature carriers at frequency $f_0 + \frac{1}{2}T$, i.e. at the central frequency of the sub-channel (T being the bit frequency).

The complex signal $\bar{x}(t)$ on the two quadrature carriers may then be written as:

$$\bar{x}(t) = \exp(-j\pi t/T) \sum_{k=0}^{N-1} X(k) \exp (2j\pi kt/Nt) \quad (4)$$

If signal x(t) is sampled at the bit frequency 1/T, successive samples x(nT) are obtained:

$$\bar{x}(nT) = (-1)^n \sum_{k=0}^{N-1} X(k) \exp (2j\pi kn/N) \quad (5)$$

Equation (5) may be written in a different from by changing the variable:

$$x(n) = [(-1)^n/N] \cdot \bar{x}(nT)$$

Then:

$$x(n) = \frac{1}{N} \sum_{k=0}^{N-1} X(k) \cdot \exp (2j\pi kn/N)$$

i.e.

$$[x(n)] = DFT^{-1}[X(k)]$$

which may as well be written:

$$X(k) = \sum_{n=0}^{N-1} x(n) \cdot \exp (-2j\pi nk/N) \quad (6)$$

According to the invention, the DFT is not applied to the N complex points, representing as many samples, during the duration $T_s$ of a symbol for demodulation in the receiver. If the transmitted signal consists of L programs each of M carriers, the result to be obtained consists only of the DFT on M carriers among N carriers. Program selection is consequently used for decimation of the DFT.

For efficient use of the DFT, one of the well known FFT algorithms is used. If the usual notations used for FFT are used, $$W = \exp (-2j\pi/n)$$

Then the FFT may write:

$$X(k) = \sum_{n=0}^{N-1} x(n) \, W^{nk}$$

The structure of the computation circuit or program directly appears from the following decomposition in two successive steps. For such Decomposition, the following symbols may be used:

k=lr+s, where s is the serial number of the processed program among 1 programs and may vary from s=0 to s=1−1 and where r is the serial number of the carrier and varies from 0 to M−1;

n=Ml+m, i.e. n may be defined using the integer quotient l of the division by M and the residue m.

It will be appreciated that a predetermined program corresponds to a particular value of s and corresponds to M carriers at mutual intervals of 1/MT, each with a different value of r.

Then X may be written as a function of s and r, as:

$$X(s,r) = \sum_{m=0}^{M-1} W^{Lmr} \cdot W^{ms} \sum_{l=0}^{L-1} x(l,m) \cdot W^{Msl}$$

The second part of the formula, beginning with $$\sum_{l=0}^{L-1}$$

will be designated as q(s,m). It would have to be computed with M DFTs on L points if program selection were carried out after transformation. Since however, it is sufficient to retain a single program at a time, function q(s,m) is a function of m only, since it corresponds to a single value of s. Computation of the different values q(s,m) is obtained with N complex multiplications only. Some of such multiplications can be trivial.

Figure 8A:
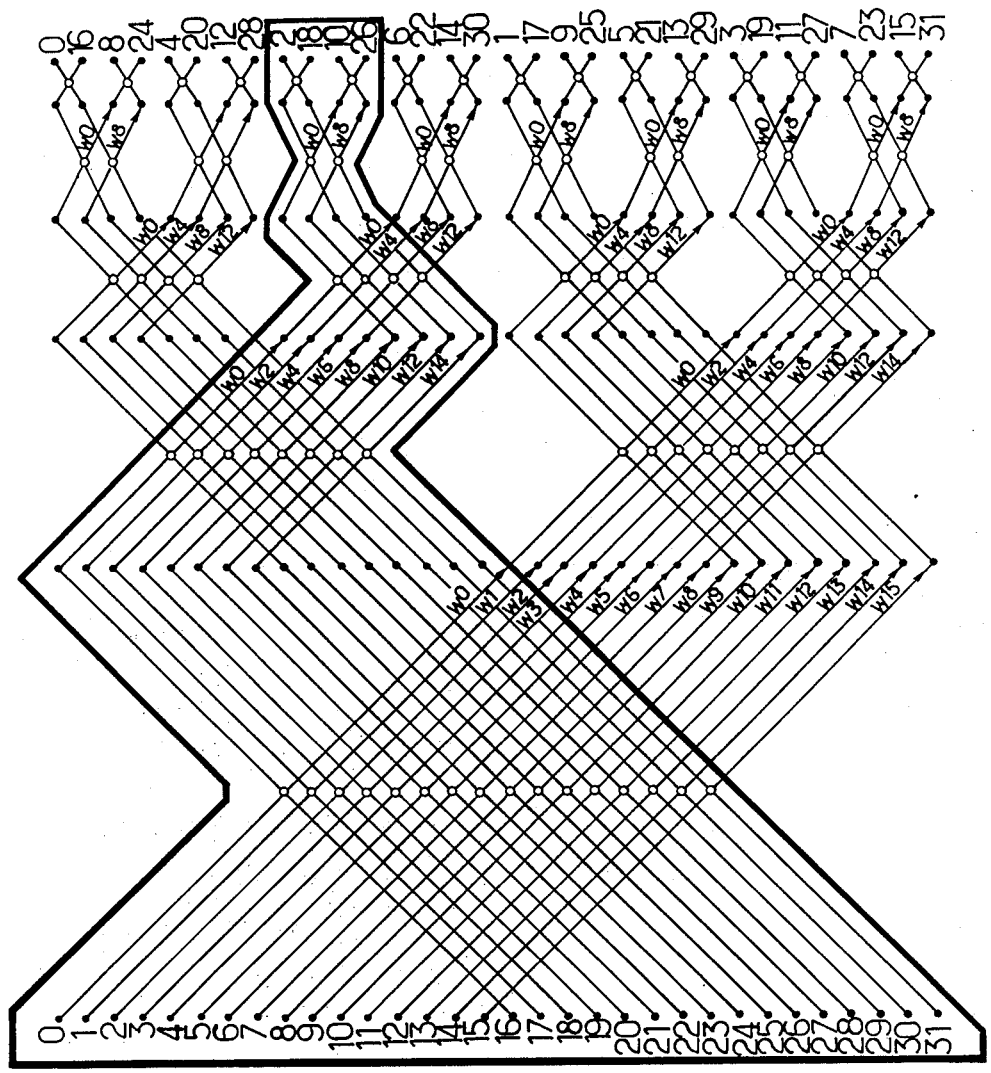
FIGS. 8A and 8B are diagrams corresponding to the use of DFTs, respectively with L=8 and M=4 and with L=5 and M=6.

Since q is known, then X may be obtained with M multiplications by factors $W^{ms}$ and one DFR over M points only. The latter operation may be carried out using one of the regular FFT algorithms if M has such a value that it is possible to write it as a product of factors. Referring to FIG. 8A, a process is described for M=4 carriers and L=8 programs. In that case, L is equal to 2 to a power and the computing sequence immediately appears. The first step uses "butterflies" on all m sampled values of x. Each butterfly is an operator which carries out an addition, a subtraction and a complex multiplication on the two input values and delivers two output values. N/2=16 butterflies are required in the example of FIG. 8A for the first step and they provide results which are written in a RAM at predetermined addresses.

During the second step, the butterflies are not applied to all results of the first step, but only on those which are stored in memory positions corresponding to the program to be received. Eight operators only are then necessary (in fact, they will be the same as those used during the first step and will operate alternatively for the two steps). Further steps of the computation are carried out. Only those operations which are indicated in the frame drawn in thick lines on FIG. 8A are necessary. As an output, the four necessary values $X_2$, $X_{10}$, $X_{18}$ et $X_{26}$ are obtained. The total number of operators which are necessary is only 16+8+4+2+2.

Among the FFT algorithms, it will be of advantage to use those which are based on values of N equal to 2 to a power. That renders it possible to use repetitive structures, such as radix 2 or 4, which are adapted to implementation with wired operators.

Figure 8B:
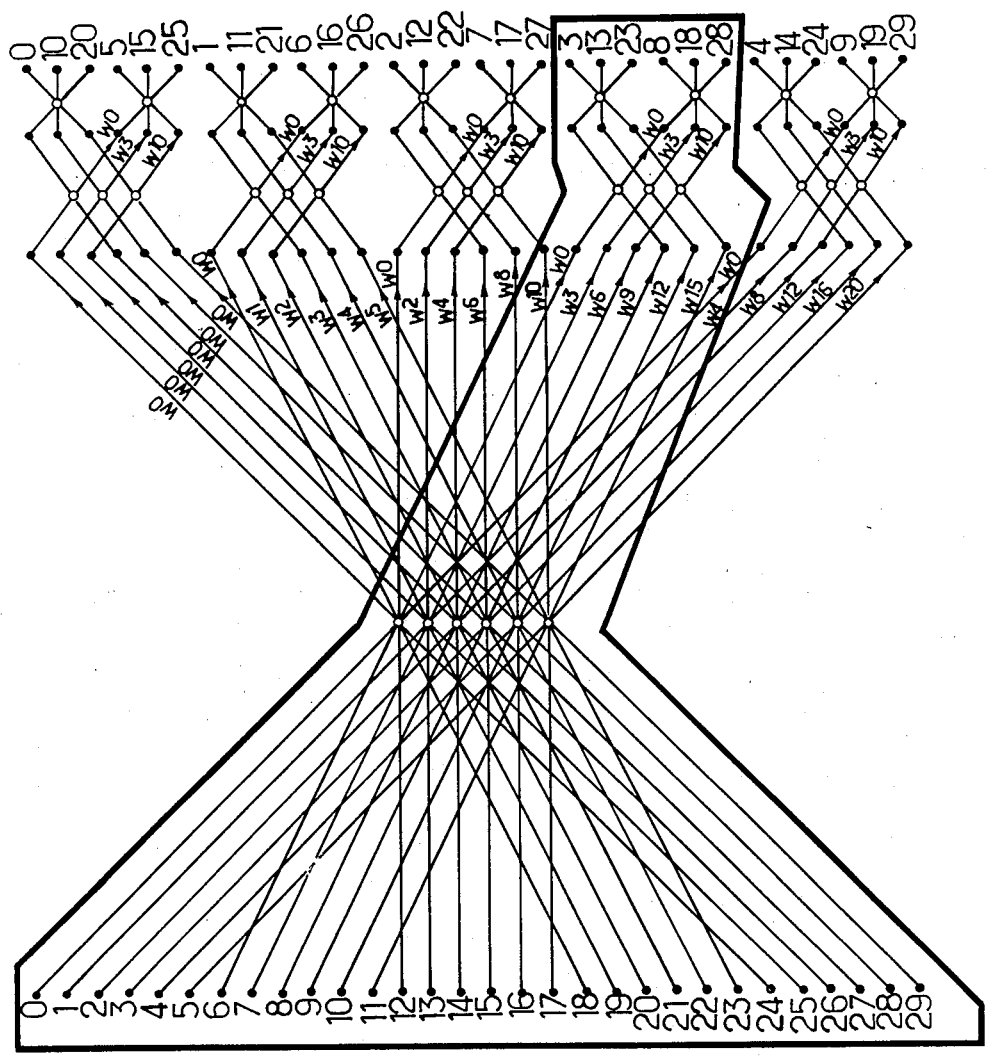

Referring now to FIG. 8B, a partial DFT which selects a program among L=5 programs each corresponding to M=6 carriers is illustrated. Again, it is not necessary to filter the useful frequencies at the input since that selection is obtained due to the decimation during the DFT.

Referring to formula (7) again, a conventional computation approach would require that values of q(s,m) be computed with M=6 on five points. According to the invention, and since a single value of s is to be considered (for instance s=3), the required values of q(3,m) are obtained with N complex multiplications only, during six DFTs each on five points, as indicated as a first computation step on FIG. 8B. The M results are multiplied with factors $W^{ms}$, which are called "twiddle" factors. Last, one DFT is to be carried out on M points only. As illustrated in FIG. 8B where M may be written as a product of factors as M=2×3, the operation is carried out using two successive FFTs first on two points, then on three points. The successive computing operations for program selection are again only those contained in the thick line frame.

The result of the partial DFT will consist of M complex numbers X(k) corresponding to formula (6) above, with k=Lr+s where r is an integer varying from 0 to N−1 and s is the serial number of the selected program.

In other words:

$$X(k) = [a(k) + ib(k)]\rho_k \exp(i\phi_k)$$

where a and b are terms already mentioned in equation (1) and $\rho_k \exp(i\phi_k)$ is the response of the channel at frequency $f_k$.

The time variations of $\rho_k$ are always slow as compared with the duration $T_s$ of a symbol, and consequently the phase $\phi_k$ may be obtained using conventional learning procedures and coherent demodulation may be used.

Differential demodulation may as well be used. However, it is less efficient when a modulation makes use of four phases. On the other hand, differential demodulation provides satisfactory results when handling two phases only. However, the use of only two phases has a detrimental effect on spectral efficiency.

It will be appreciated that a multiplication with exp. ($j\phi_k$) provides the transmitted data a and b multiplied by factor $\rho_k$.

For recovering the real data from the result of the multiplication, an evaluation and decision procedure is carried out. For increasing the performances, it is much preferable to use a self correcting code and a "soft" decision as described above.

As already mentioned above, time-frequency interlacing provides maximum mutual independence of the received samples. Combination of soft decoding and interlacing (which may be by blocks, convolutive or pseudo-random) substantially eliminates grouped errors due to fading at a particular frequency.

For implementing the invention, an transmitter substantially similar to that of FIGS. 3 and 5 may again be used, however adapted for QAM.

Figure 9:
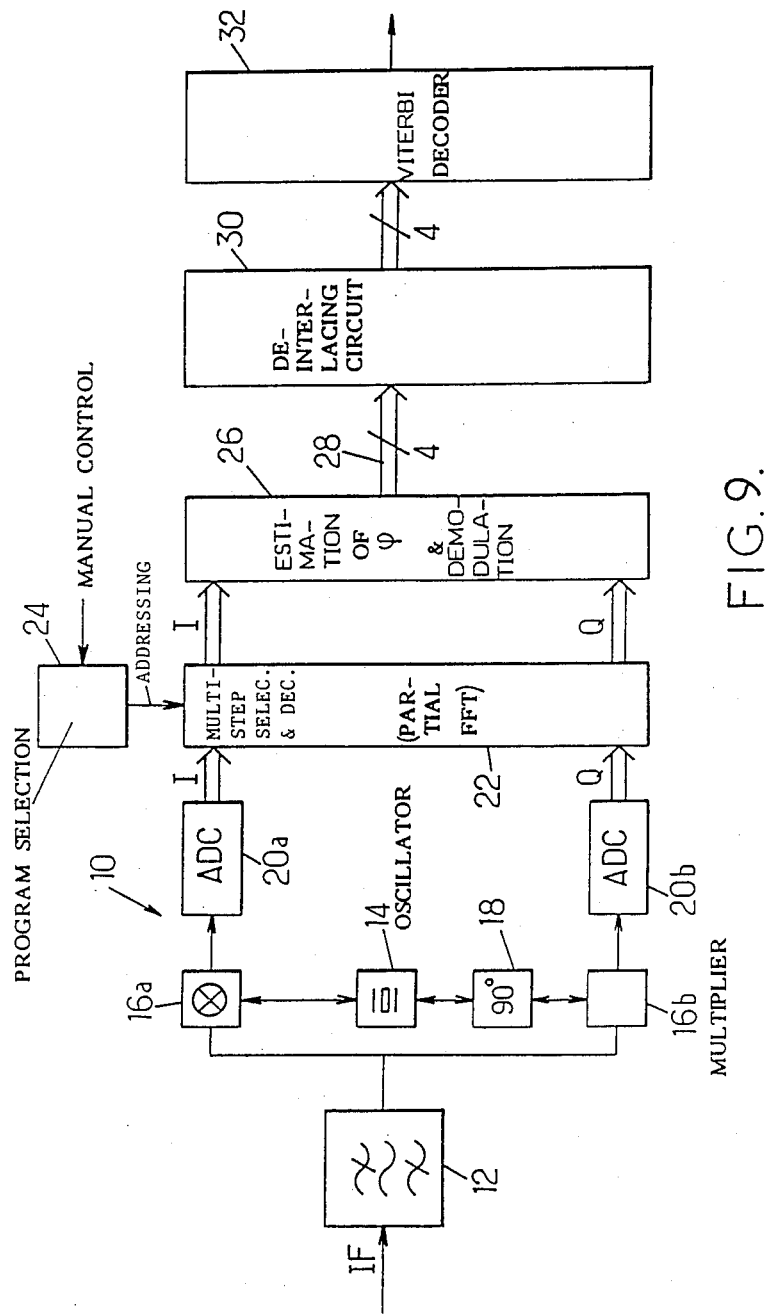
FIG. 9 is a block diagram of the general arrangement of another receiver.

The receiver may have the construction illustrated in block form on FIG. 9. It includes conventional input stages which deliver a signal at an intermediary frequency IF. The decoder 10 has a channel filter 12, consisting of a pass-band filter whose band width corresponds to the whole spectrum required by the set of N broadcasting carriers.

The output signal of filter 12 is projected on two quadrature carriers at the central frequency of the channel. That frequency is delivered by an oscillator 14 which directly drives one of the inputs of a first multiplier 16a and drives an input of another multiplier 16b through a phase shifter 18. The two multipliers receive the output signal of filter 12. The output of each multiplier is applied to an analog/digital converter 20a or 20b which delivers samples which are applied to the FFT computation circuit 22. A program selection circuit provided with manually controlled switch means (not shown) is associated with circuit 22 and delivers the addresses of the samples on which computation should be carried out in a memory which stores the intermediary results in circuit 22. The selected samples are applied to a learning circuit 26 for phase estimation and for demodulation. That circuit may consist of integrated circuits available in the trade, such as TMS 320. The data 28, available as words of four bits, are applied to a de-interlacing circuit 30, then to a Viterbi decoder 32 which may be similar to those described with reference to FIG. 6.

The demodulator consisting of components 14–20 may be of a conventional type. The oscillator 14 may be servocontrolled or frequency transposition may be carried out after analog/digital conversion by complex multiplication in base band immediately before the FFT. The latter solution is of advantage if LSI circuits are used. As an example of documents describing such demodulation units, reference may be had to the article by Baccetti et al, "Full Digital Adaptive Equalization in 64QAM Radio Systems" in the proceedings of ICC 86 meeting, Toronto. A description of a unit having an adaptive equalizer may be found in "A Stepped Square 256 QAM for Digital Radio System" by Toshihiko Ryu et al., published in the proceedings of the above-mentioned meeting, reference 46-6, pp. 1477–1481.

We claim:

1. Digital broadcasting process comprising:
   sampling information from a source to obtain data consisting of digital words,
   encoding the bits of said words using a redundant encoder to obtain a sequence of modulation symbols representing a message,
   transmitting said symbols in a plurality M of subchannels at different frequencies, with simultaneous transmission of M different ones of said symbols with such time interlacing that two adjacent symbols in the message cannot be transmitted in time succession at the same one of said frequencies, each symbol being transmitted once only.

2. Process according to claim 1, characterized by the further step of decoding said symbols in a receiver by restoring the original sequence of symbols and evaluating bits of said digital words from the symbols as received with a maximum likeihood algorithm.

3. Process according to claim 2, characterized in that the bits are encoded according to a convolutive code and frequency distribution is achieved by modulating each one of n subchannels at two modulation levels.

4. Digital data broadcast system, comprising:
   a transmitter having a convolutional encoder delivering digital samples, means for time interlacing the coded symbols and assigning to each one a longer transmission time duration than that used for diversity transmission by distributing them over a plurality of paths of a transmission channel, at different frequencies, and
   a receiver having means for recovering the coded symbols, means for de-interlacing the coded symbols and means for storing the coded symbols over a period of time sufficient to evaluate the original binary sequence by determining paths of maximum likeihood in the lattice for trellis diagram formed by the convolution.

5. Digital broadcasting process comprising:
   sampling information from a source to obtain data consisting of digital words,
   encoding the bits of said words using a redundant coder to obtain a sequence of modulation symbols,
   transmitting said symbols with time interlacing of said symbols and simultaneous transmission of a plurality M of different ones of said symbols in M subchannels at different frequencies; and
   demodulating said M subchannels, and only said M subchannels, simultaneously by applying a DFT to said M subchannels.

6. Process according to claim 5, characterized in that a plurality L of programs are simultaneously broadcast and the M subchannels corresponding to a same one of said programs are frequency interleaved with the subchannels allocated to the other programs.

7. Process according to claim 6, characterized in that said simultaneous demodulation is carried out by fast Fourier transform in a plurality of successive steps, said FFT being achieved with operators and being applied:
   during a first step, to all symbols received on all said subchannels,
   during all following steps, to only those of said symbols which are required for demodulation of the M subchannels corresponding to a predetermined one of said programs.

8. Broadcasting system, comprising:
   a transmitter for broadcasting a plurality of programs, having: means for delivering samples of data of a plurality of programs to be broadcast; convolutional encoder means delivering, from said samples, digital symbols for each of the programs; means for time interlacing the symbols and for distributing the symbols of the same program between a plurality of subchannels at different frequencies, the frequencies dedicated to different programs being mutually interleaved; and
   a receiver having de-interlacing means and means for simultaneously demodulating and selecting a particular program in terms of DFT applied only to those subchannels which correspond to the selected program.

* * * * *